United States Patent
Liao et al.

(10) Patent No.: US 8,791,022 B2
(45) Date of Patent: Jul. 29, 2014

(54) METHOD FOR REDUCING WORDLINE BRIDGE RATE

(75) Inventors: Jeng-Hwa Liao, Hsin chu (TW); Jung-Yu Shieh, Hsin chu (TW); Ling-Wu Yang, Hsin chu (TW)

(73) Assignee: Macronix International Co. Ltd. (TW)

( * ) Notice: Subject to any disclaimer, the term of this patent is extended or adjusted under 35 U.S.C. 154(b) by 487 days.

(21) Appl. No.: 12/952,902

(22) Filed: Nov. 23, 2010

(65) Prior Publication Data

US 2012/0129350 A1 May 24, 2012

(51) Int. Cl.
*H01L 21/311* (2006.01)

(52) U.S. Cl.
USPC ............................................. 438/702

(58) Field of Classification Search
CPC ............ H01L 21/2257; H01L 21/3213; H01L 21/32131–21/32139
USPC ............................................................ 438/702
See application file for complete search history.

(56) References Cited

U.S. PATENT DOCUMENTS

| | | | | |
|---|---|---|---|---|
| 5,545,578 | A | * | 8/1996 | Park et al. ..................... 438/303 |
| 6,037,194 | A | * | 3/2000 | Bronner et al. ............... 438/147 |
| 2009/0061609 | A1 | * | 3/2009 | Lu et al. ......................... 438/591 |
| 2010/0112811 | A1 | * | 5/2010 | Yeh et al. ...................... 438/669 |
| 2011/0104881 | A1 | * | 5/2011 | Lee et al. ...................... 438/591 |

\* cited by examiner

*Primary Examiner* — Shaun Campbell
(74) *Attorney, Agent, or Firm* — Volpe and Koenig, P.C.

(57) ABSTRACT

The method of forming a wordline is provided in the present invention. The proposed method includes steps of: (a) etching a metal-silicide layer and a POLY layer via a hard mask, wherein the metal-silicide layer is disposed on the POLY layer; (b) forming a POLY recess in the POLY layer; and (c) forming a liner film covering the metal-silicide layer.

19 Claims, 6 Drawing Sheets

METHOD FOR REDUCING WORDLINE BRIDGE RATE

FIELD OF THE INVENTION

The present invention relates to a method of forming a semiconductor element (e.g., a wordline). More particularly, it relates to a method for reducing wordline bridge rate.

BACKGROUND OF THE INVENTION

Nowadays, semiconductor devices are frequently used in a variety of electronic applications, such as personal computers and cellular phones, for example. One such semiconductor device widely used in electronic systems for storing data is a semiconductor memory (for example, an XtraROM, a charge trapping memory, a non-volatile memory and an embedded memory).

Memory devices such as the XtraROM, the charge trapping memory, the non-volatile memory and the embedded memory are typically arranged in an array of memory cells. A memory cell typically includes an access field effect transistor (FET) and a storage capacitor. A source/drain region of the cell access FET is coupled to a bitline, and the other source/drain region is coupled to a plate of a respective storage capacitor. The other plate of the capacitor is coupled to a common plate reference voltage. The gate of the transistor is coupled to a wordline. The storing and accessing of information into and from memory cells are achieved by selecting and applying voltages to the wordlines and bitlines.

In fabricating semiconductor devices such as the XtraROM, the charge trapping memory, the non-volatile memory and the embedded memory, the wordline bridge is a problem frequently encountered and this problem needs to be overcome to improve the reliability of these memory devices.

The wordline bridge can be overcame by etch. However, the profile would be re-entrant after etch, and it is hard to well control the device reliability when the device is scaling down. Hot standard clean 1 (SC1) can be used to isotropic etch the POLY and hence reduce the wordline bridge rate for the productions of the memory devices such as the XtraROM, the charge trapping memory, the non-volatile memory and the embedded memory. However, the hot SC1 would etch the metal-silicide layer such as a WSi layer simultaneously and cause the resistances increased.

Keeping the drawbacks of the prior arts in mind, and employing experiments and research full-heartily and persistently, the applicants finally conceived a method for reducing a wordline bridge rate.

SUMMARY OF THE INVENTION

It is therefore an object of the present invention to provide a method of forming a semiconductor element and a method of forming a wordline, each of which includes a step of forming a liner film covering/enclosing the metal-silicide layer, and the liner film is used to prevent the metal-silicide layer from being etched by a SC1 and to reduce a wordline bridge rate.

According to the first aspect of the present invention, a method of forming a wordline includes steps of: (a) performing a wordline hard mask etch; (b) performing a wordline metal-silicide etch to form a POLY recess under an interface of a metal-silicide layer and a POLY layer; (c) performing a liner deposition; (d) performing a liner and POLY etch to form a liner film; and (e) performing a hot standard clean 1 (SC1) dip.

According to the second aspect of the present invention, a method of forming a wordline includes steps of: (a) etching a metal-silicide layer and a POLY layer via a hard mask, wherein the metal-silicide layer is disposed on the POLY layer; (b) forming a POLY recess in the POLY layer; and (c) forming a liner film covering the metal-silicide layer.

According to the third aspect of the present invention, a method of forming a semiconductor element includes steps of: (a) performing a wordline hard mask etch; (b) performing a wordline metal-silicide etch to form a POLY recess; (c) performing a liner deposition; and (d) performing a liner etch to form a liner film.

According to the fourth aspect of the present invention, a method of forming a semiconductor element includes a step of forming a liner film enclosing a metal-silicide layer to prevent the metal-silicide layer from being etched by a SC1.

The present invention may best be understood through the following descriptions with reference to the accompanying drawings, in which:

DETAILED DESCRIPTION OF THE PREFERRED EMBODIMENT

As aforementioned, the present invention is aimed at preventing the metal-silicide layer from being etched by a SC1 and reducing a wordline bridge rate not only in the process for fabricating a wordline, but also in other fabricating processes involving wordline bridge problems such as in a fabricating process of an XtraROM, a charge trapping memory, a non-volatile memory, or an embedded memory.

A critical issue of the present invention is to provide a step of forming a liner film covering/enclosing the metal-silicide layer so as to prevent the metal-silicide layer from being etched by a SC1 and to reduce a wordline bridge rate such that a wordline bridge problem could be easily solved.

The proposed method of forming a wordline according to the first preferred embodiment of the present invention comprises steps of: (a) performing a wordline hard mask etch; (b) performing a wordline metal-silicide etch to form a POLY recess under an interface of a metal-silicide layer and a POLY layer; (c) performing a liner deposition; (d) performing a liner and POLY etch to form a liner film; and (e) performing a hot standard clean 1 (SC1) dip.

The proposed method of forming a wordline according to the first preferred embodiment of the present invention further comprises steps of: (f) performing a wordline re-oxidation; and (g) performing a spacer oxide deposition to form the wordline, wherein the liner film is used to prevent the metal-silicide layer from being etched by a SC1 and to reduce a wordline bridge rate.

The proposed step (a) further comprises steps of: (a1) providing a substrate; (a2) providing the POLY layer deposited on the substrate; and (a3) providing the metal-silicide layer deposited on the POLY layer. In the proposed method, the substrate is an ONO layer, and the metal-silicide layer is one selected from a group consisting of WSi, CoSi and NiSi.

Figure 1:
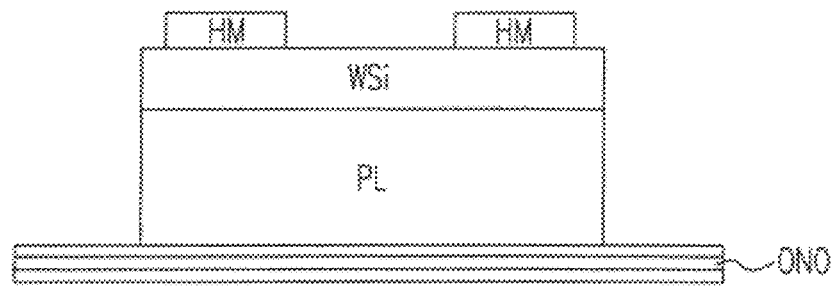
FIG. 1 shows a schematic diagram of the proposed wordline fabricating process, corresponding to a specific moment in time right after the step (a) of the provided method, according to the first preferred embodiment of the present invention.

FIG. 1 shows a schematic diagram of the proposed wordline fabricating process, corresponding to a specific moment in time right after the step (a) of the provided method, according to the first preferred embodiment of the present invention. In FIG. 1, it shows two hard masks (HMs), the substrate being an ONO layer (ONO), the POLY layer (PL) and the metal-silicide layer being a WSi layer (WSi).

Figure 2:
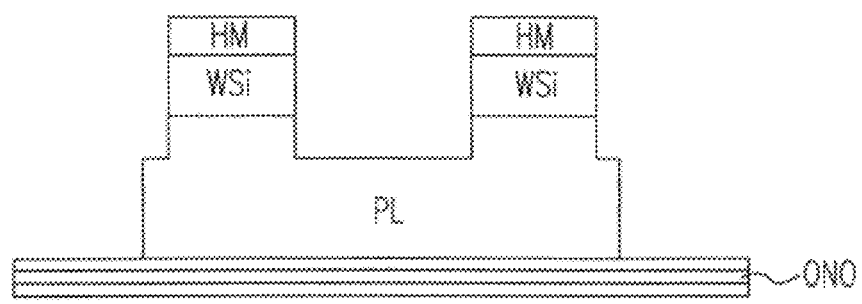
FIG. 2 shows a schematic diagram of the proposed wordline fabricating process, corresponding to a specific moment in time right after the step (b) of the provided method, according to the first preferred embodiment of the present invention.

FIG. 2 shows a schematic diagram of the proposed wordline fabricating process, corresponding to a specific moment in time right after the step (b) of the provided method, according to the first preferred embodiment of the present invention. In FIG. 2, the proposed step (b) is performed to etch the WSi layer (WSi) and the POLY layer (PL) so as to form a POLY recess under an interface of the WSi layer (WSi) and the POLY layer (PL).

Figure 3:
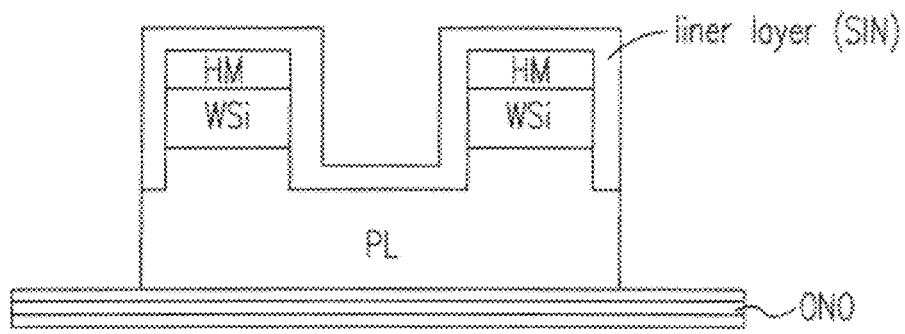
FIG. 3 shows a schematic diagram of the proposed wordline fabricating process, corresponding to a specific moment in time right after the step (c) of the provided method, according to the first preferred embodiment of the present invention.

FIG. 3 shows a schematic diagram of the proposed wordline fabricating process, corresponding to a specific moment in time right after the step (c) of the provided method, according to the first preferred embodiment of the present invention. The proposed step (c) further comprises a step of (c1) performing the liner deposition on the metal-silicide layer and the POLY layer to form a liner layer. The liner layer and the liner film are one selected from a group consisting of an LPCVD SIN, an ALD SIN, an LPCVD OX, an ALD OX, an ISSG OX and a radical OX, and the LPCVD OX is one of a TEOS and an HTO. In FIG. 3, the liner layer comprises silicon nitride (SIN).

Figure 4:
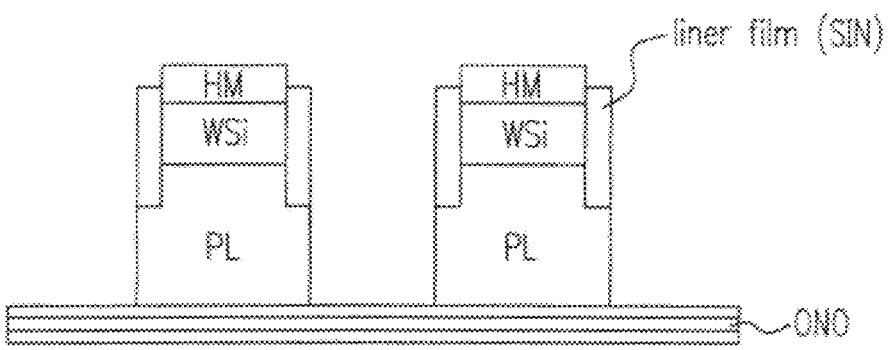
FIG. 4 shows a schematic diagram of the proposed wordline fabricating process, corresponding to a specific moment in time right after the step (d) of the provided method, according to the first preferred embodiment of the present invention.

FIG. 4 shows a schematic diagram of the proposed wordline fabricating process, corresponding to a specific moment in time right after the step (d) of the provided method, according to the first preferred embodiment of the present invention. In FIG. 4, the liner layer (SIN) and the POLY layer (PL) are etched back to form the liner film (SIN). And, a thickness of the liner film is ranged from 20 Å (angstrom) to 150 Å.

Figure 5:
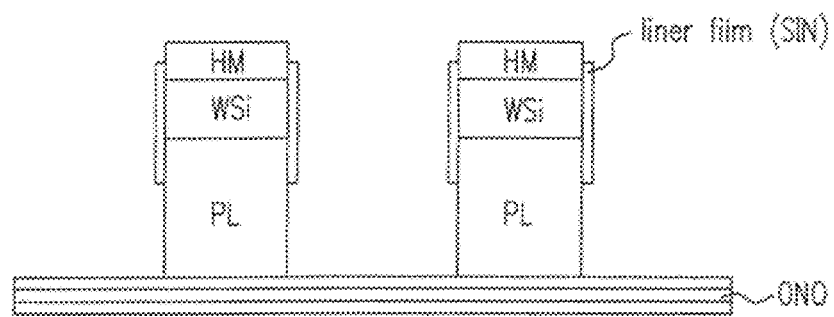
FIG. 5 shows a schematic diagram of the proposed wordline fabricating process, corresponding to a specific moment in time right after the step (e) of the provided method, according to the first preferred embodiment of the present invention.

FIG. 5 shows a schematic diagram of the proposed wordline fabricating process, corresponding to a specific moment in time right after the step (e) of the provided method, according to the first preferred embodiment of the present invention. In FIG. 5, the SC1 etches the liner film (SIN) and the POLY layer (PL) further. The SC1 comprises $NH_4OH$, $H_2O_2$ and DI, and the SC1 has a ratio of $NH_4OH/H_2O_2$ ranged from 1/1 to 4/1. Also, the SC1 has a temperature ranged from 30° C. to 90° C. during a period of the hot SC1 dip.

Figure 6:
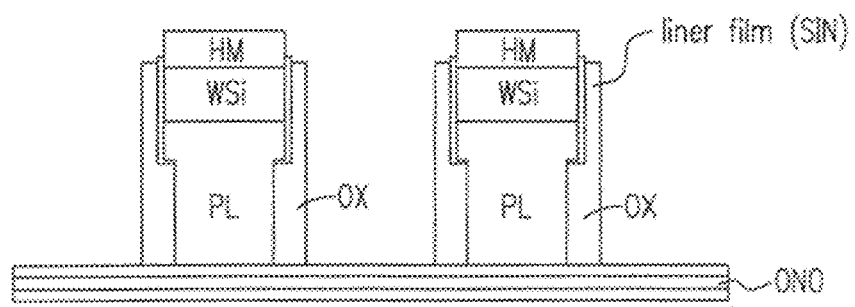
FIG. 6 shows a schematic diagram of the proposed wordline fabricating process, corresponding to a specific moment in time right after the step (f) of the provided method, according to the first preferred embodiment of the present invention.

FIG. 6 shows a schematic diagram of the proposed wordline fabricating process, corresponding to a specific moment in time right after the step (f) of the provided method, according to the first preferred embodiment of the present invention. The proposed step (f) further comprises a step of (f1) depositing a layer of oxide around the poly layer and the liner film, wherein the layer of oxide comprises SiO2. In FIG. 6, the layer of oxide (OX) is deposited around the poly layer (PL) and the liner film (SIN).

Figure 7:
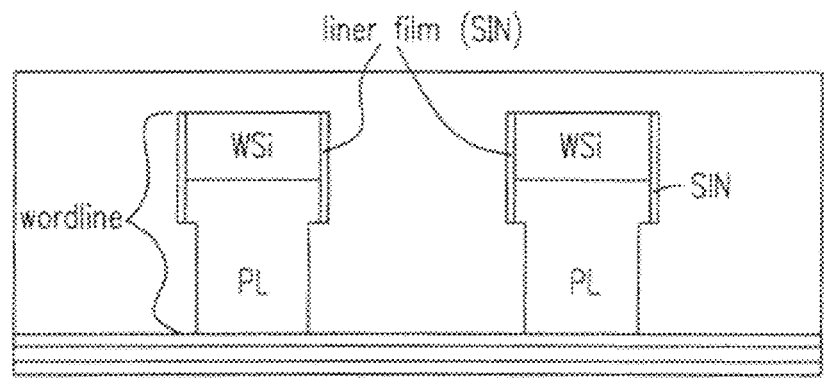
FIG. 7 shows a schematic diagram of the proposed wordline fabricating process, corresponding to a specific moment in time right after the step (g) of the provided method, according to the first preferred embodiment of the present invention.

FIG. 7 shows a schematic diagram of the proposed wordline fabricating process, corresponding to a specific moment in time right after the step (g) of the provided method, according to the first preferred embodiment of the present invention. The proposed step (g) further comprises steps of (g1) removing the hard mask; and (g2) filling in a spacer oxide. In FIG. 7, the two hard masks as shown in FIG. 6 are removed and the spacer oxide (OX) is filled in (between each pair of wordlines). Referring to FIG. 7, it shows two wordlines, each of which includes a POLY layer (PL) and the metal-silicide layer (WSi), four liner films, and the layer of oxide and the spacer oxide (both of which comprise OX, i.e. SiO2).

According to the second preferred embodiment of the present invention, a method of forming a wordline could be simplified and includes steps of: (a) etching a metal-silicide layer and a POLY layer via a hard mask, wherein the metal-silicide layer is disposed on the POLY layer; (b) forming a POLY recess in the POLY layer; and (c) forming a liner film covering the metal-silicide layer.

According to the second preferred embodiment of the present invention, the proposed method further comprises steps of: (d) performing a hot standard clean 1 (SC1) dip; (e) performing a wordline re-oxidation; and (f) performing a spacer oxide deposition to form the wordline, wherein the liner film is used to prevent the metal-silicide layer from being etched by a SC1 so as to reduce a wordline bridge rate.

According to the second preferred embodiment of the present invention, the POLY recess cuts through the metal-silicide layer, and then cuts into the POLY layer.

According to the third aspect of the present invention, a method of forming a semiconductor element includes steps of: (a) performing a wordline hard mask etch; (b) performing a wordline metal-silicide etch to form a POLY recess; (c) performing a liner deposition; and (d) performing a liner etch to form a liner film.

According to the third preferred embodiment of the present invention, the POLY recess passes through a metal-silicide layer and cuts into a POLY layer, and the liner film is used to prevent the metal-silicide layer from being etched by a standard clean 1 (SC1) so as to reduce a wordline bridge rate of the semi-conductor element.

According to the third preferred embodiment of the present invention, the aforementioned method further comprises steps of: (e) performing a hot SC1 dip; (f) performing a wordline re-oxidation; and (g) performing a spacer oxide deposition to form the semiconductor element.

According to the third preferred embodiment of the present invention, the semi-conductor element is one selected from a group consisting of an XtraROM, a charge trapping memory, a non-volatile memory and an embedded memory.

According to the fourth aspect of the present invention, a method of forming a semiconductor element includes a step of forming a liner film enclosing a metal-silicide layer to prevent the metal-silicide layer from being etched by a SC1.

Figure 8:
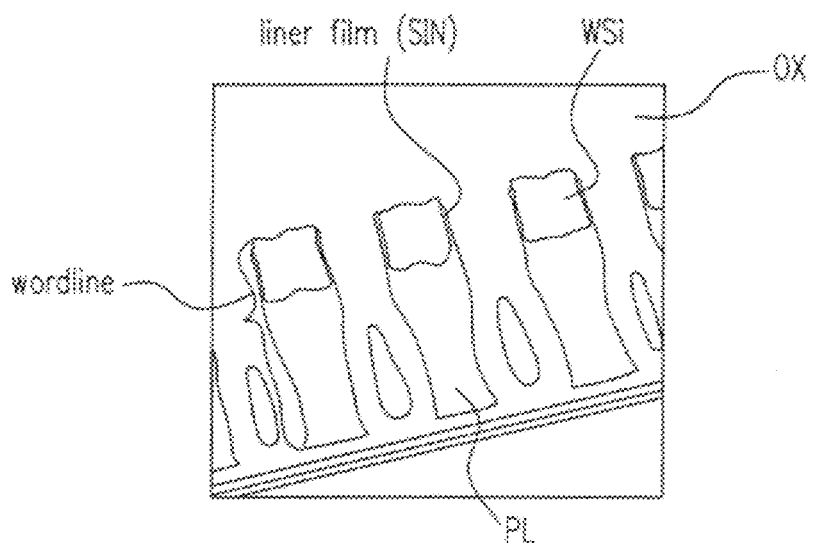
FIG. 8 shows a cross-sectional diagram of a final product of plural wordlines according to the first to the fourth preferred embodiments of the present invention.

FIG. 8 shows a cross-sectional diagram of a final product of plural wordlines according to the first to the fourth preferred embodiments of the present invention. In FIG. 8, it shows the plural wordlines, each of which includes the POLY layer (PL) and the metal-silicide layer (WSi), the plural liner films and the OX (SiO2) including the layer of oxide and the spacer oxide.

Figure 9:
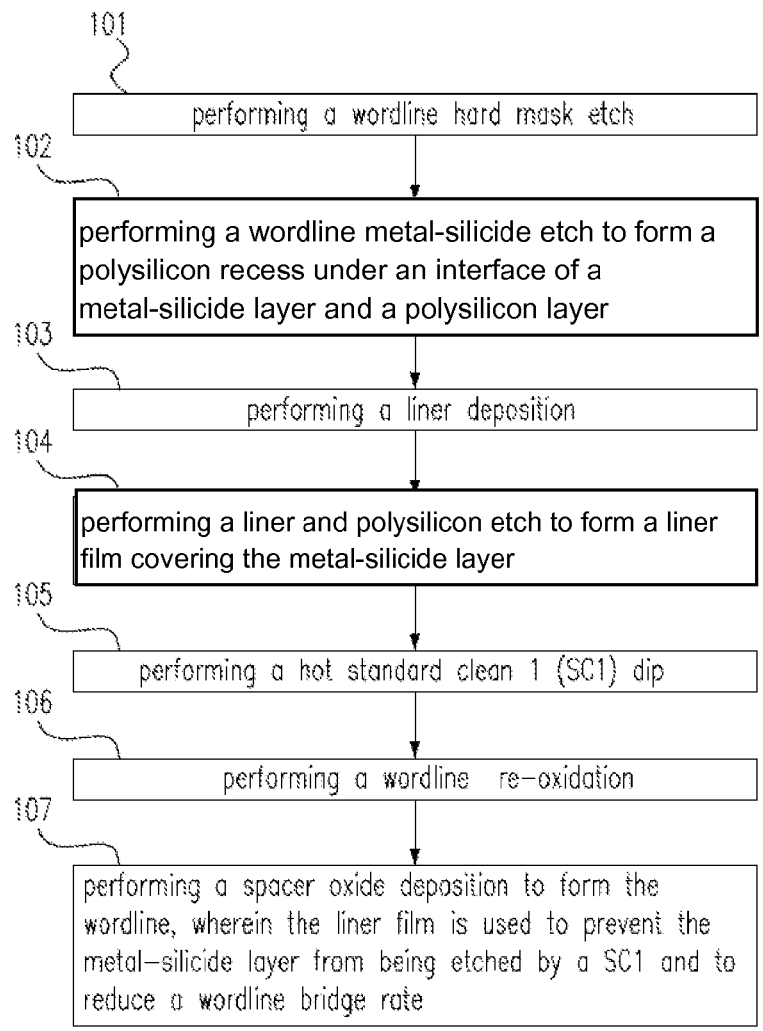
FIG. 9 shows a flow chart of the critical steps of the proposed methods according to the first to the fourth preferred embodiments of the present invention respectively.

FIG. 9 shows a flow chart of the critical steps of the proposed methods according to the first to the fourth preferred embodiments of the present invention respectively. Step 101 of FIG. 9 corresponds to the step (a) of the aforementioned methods according to the first to the third preferred embodiments. Step 102 of FIG. 9 corresponds to the step (b) of the aforementioned methods according to the first to the third preferred embodiments of the present invention (it is simplified as "forming a POLY recess in the POLY layer" in the second preferred embodiment and performing a wordline metal-silicide etch to form a POLY recess in the second preferred embodiment respectively). Step 103 of FIG. 9 corresponds to the step (c) of the aforementioned methods according to the first and the third preferred embodiments of the present invention. Step 104 of FIG. 9 corresponds to the respective steps of (d)/(c)/(d)/(d) of the aforementioned methods according to the first to the fourth preferred embodiments of the present invention (it is simplified as "forming a liner film covering the metal-silicide layer" in the second preferred embodiment and "performing a liner etch to form a liner film" in the third preferred embodiment, and is adjusted as "forming a liner film enclosing a metal-silicide layer to prevent the metal-silicide layer from being etched by a SC1" in the fourth preferred embodiment respectively). Step 105 of FIG. 9 corresponds to the step of (e)/(d)/(e) of the aforementioned methods according to the first/second/third preferred embodiments of the present invention respectively (it is simplified as "performing a hot SC1 dip" in the third preferred embodiment). Step 106 of FIG. 9 corresponds to the step of (f)/(e)/(f) of the aforementioned methods according to the first/second/third preferred embodiments of the present invention respectively. Step 107 of FIG. 9 corresponds to the step of (g)/(f)/(g) of the aforementioned methods according to the first/second/third preferred embodiments of the present invention respectively (it is adjusted as "performing a spacer oxide deposition to form the semiconductor element" in the third preferred embodiment).

Figure 10:
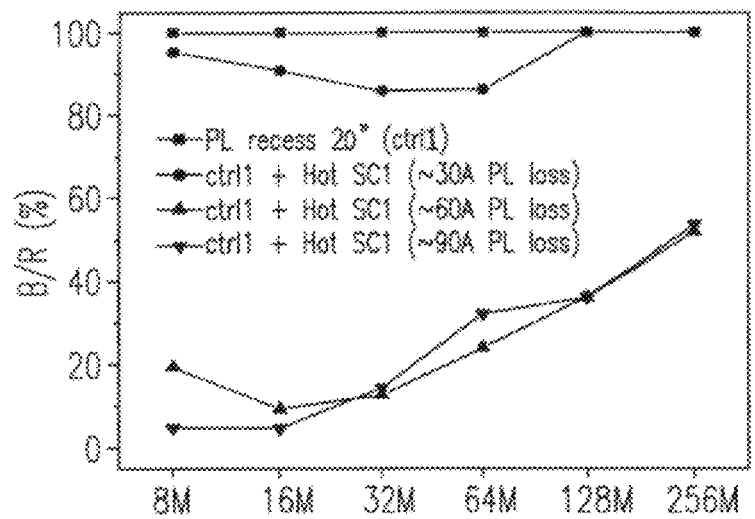
FIG. 10 shows a diagram of experimental results of bridge rate versus memory density using the POLY recess formed in 20 seconds as a first control group and three different SC1 dip time according to the third preferred embodiment of the present invention.

FIG. 10 shows a diagram of experimental results of bridge rate versus memory density using the POLY recess formed in 20 seconds as a first control group and three different SC1 dip time (with 30 Å PL loss, 60 Å PL loss and 90 Å PL loss respectively) according to the third preferred embodiment of the present invention. The total wordline bridge rate is decreased when the hot SC1 dip time is increased.

Figure 11:
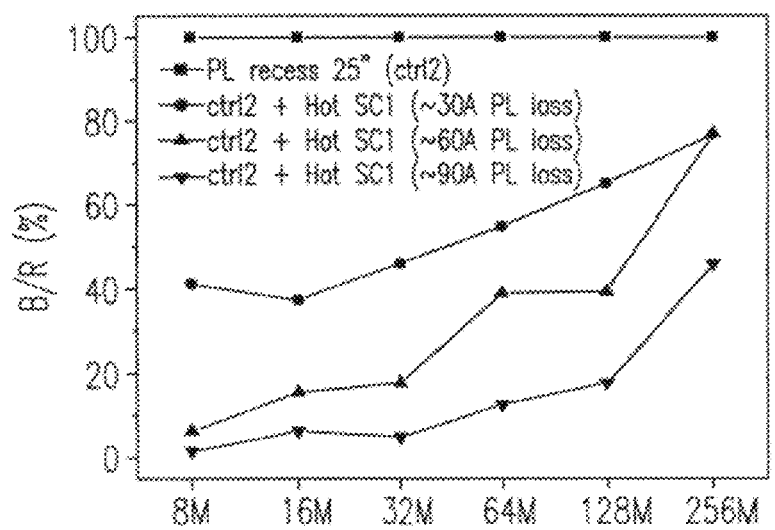
FIG. 11 shows a diagram of experimental results of bridge rate versus memory density using the POLY recess formed in 25 seconds as a second control group and three different SC1 dip time according to the third preferred embodiment of the present invention.

FIG. 11 shows a diagram of experimental results of bridge rate versus memory density using the POLY recess formed in 25 seconds as a second control group and three different SC1 dip time (with 30 Å PL loss, 60 Å PL loss and 90 Å PL loss respectively) according to the third preferred embodiment of the present invention. The total wordline bridge rate is also decreased when the hot SC1 dip time is increased.

According to the aforementioned descriptions, the present invention provides a method of forming a semiconductor element and a method of forming a wordline, each of which includes a step of forming a liner film covering/enclosing the metal-silicide layer, and the liner film is used to prevent the metal-silicide layer from being etched by a SC1 and to reduce a wordline bridge rate.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims, which are to be accorded with the broadest interpretation so as to encompass all such modifications and similar structures. Therefore, the above description and illustration should not be taken as limiting the scope of the present invention which is defined by the appended claims.

What is claimed is:

1. A method of forming a wordline, comprising steps of:
    (a) performing a wordline hard mask etch;
    (b) performing a wordline metal-silicide etch to form a polysilicon layer recess under an interface of a metal-silicide layer and a polysilicon layer having a top portion;
    (c) performing a liner deposition;
    (d) performing a liner and polysilicon layer etch to form a liner film covering the metal-silicide layer and the top portion; and
    (e) performing a hot standard clean 1 (SC1) dip to form a T-shaped polysilicon layer.

2. A method according to claim 1 further comprising steps of:
    (f) performing a wordline re-oxidation; and
    (g) performing a spacer oxide deposition to form the wordline,
    wherein the liner film is used to prevent the metal-silicide layer from being etched by a SC1 and to reduce a wordline bridge rate.

3. A method according to claim 2, wherein the step (f) further comprises a step of (f1) depositing a layer of oxide around the polysilicon layer and the liner film, and the step (g) further comprises steps of (g1) removing the hard mask; and (g2) filling in a spacer oxide, wherein the layer of oxide and the spacer oxide both comprise SiO2.

4. A method according to claim 2, wherein the SC1 comprises $NH_4OH$, $H_2O_2$ and DI, and the SC1 has a ratio of $NH_4OH/H_2O_2$ ranged from 1/1 to 4/1.

5. A method according to claim 2, wherein the SC1 has a temperature ranged from 30° C. to 90° C. during a period of the hot SC1 dip.

6. A method according to claim 1, wherein the step (a) further comprises steps of:
    (a1) providing a substrate;
    (a2) providing the polysilicon layer deposited on the substrate; and
    (a3) providing the metal-silicide layer deposited on the polysilicon layer.

7. A method according to claim 6, wherein the substrate is an ONO layer, and the metal-silicide layer is one selected from a group consisting of WSi, CoSi and NiSi.

8. A method according to claim 1, wherein a thickness of the liner film is ranged from 20 Å (angstrom) to 150 Å.

9. A method according to claim 1, wherein the step (a) further comprises a step of (a1) etching the metal-silicide layer and the polysilicon layer.

10. A method according to claim 1, wherein the step (c) further comprises a step of (c1) performing the liner deposition on the metal-silicide layer and the polysilicon layer to form a liner layer.

11. A method according to claim 10, wherein the liner layer and the liner film are one selected from a group consisting of an LPCVD SIN, an ALD SIN, an LPCVD OX, an ALD OX, an ISSG OX and a radical OX.

12. A method according to claim 11, wherein the LPCVD OX is one of a TEOS and an HTO.

13. A method of forming a wordline, comprising steps of:
(a) etching a metal-silicide layer and a polysilicon layer, via a hard mask, wherein the metal-silicide layer is disposed on the polysilicon layer;
(b) forming a polysilicon recess in the polysilicon layer; and
(c) forming a liner film covering the metal-silicide layer so as to cause the polysilicon layer to have a top portion with a first width and a bottom portion with a second width being smaller than the first width to form a T-shape.

14. A method according to claim 13 further comprising steps of:
(d) performing a hot standard clean 1 (SC1) dip to form the top portion and the bottom portion;
(e) performing a wordline re-oxidation; and
(f) performing a spacer oxide deposition to form the wordline,
wherein the liner film is used to prevent the metal-silicide layer from being etched by a SC1 so as to reduce a wordline bridge rate.

15. A method according to claim 14, wherein the polysilicon layer recess cuts through the metal-silicide layer, and then cuts into the polysilicon layer.

16. A method of forming a semiconductor element, comprising steps of:
(a) performing a wordline hard mask etch;
(b) performing a wordline metal-silicide etch to form a polysilicon layer recess in a polysilicon layer;
(c) performing a liner deposition; and
(d) performing a liner etch to form a liner film so as to cause the polysilicon layer to have a top portion with a first width and a bottom portion with a second width being smaller than the first width to form a T-shape.

17. A method according to claim 16, wherein the polysilicon layer recess passes through a metal-silicide layer and cuts into the polysilicon layer, and the liner film is used to prevent the metal-silicide layer from being etched by a standard clean 1 (SC1) so as to reduce a wordline bridge rate of the semiconductor element.

18. A method according to claim 17 further comprises steps of:
(e) performing a hot SC1 dip to form the first portion and the second portion;
(f) performing a wordline re-oxidation; and
(g) performing a spacer oxide deposition to form the semiconductor element.

19. A method according to claim 16, wherein the semiconductor element is one selected from a group consisting of an XtraROM, a charge trapping memory, a non-volatile memory and an embedded memory.

* * * * *